United States Patent
Wang et al.

(10) Patent No.: US 12,143,109 B1
(45) Date of Patent: Nov. 12, 2024

(54) DEVICE FOR CORRECTING DUTY CYCLE AND METHOD FOR CORRECTING DUTY CYCLE

(71) Applicant: MediaTek Singapore Pte. Ltd., Singapore (SG)

(72) Inventors: Ming Wang, Anhui (CN); Kun Lan, Anhui (CN); Cong Liu, Anhui (CN)

(73) Assignee: MediaTek Singapore Pte. Ltd., Singapore (SG)

( * ) Notice: Subject to any disclaimer, the term of this patent is extended or adjusted under 35 U.S.C. 154(b) by 0 days.

(21) Appl. No.: 18/206,093

(22) Filed: Jun. 6, 2023

(30) Foreign Application Priority Data

Apr. 20, 2023 (CN) .......................... 202310430331.8

(51) Int. Cl.
*H03K 3/017* (2006.01)
*H03K 5/135* (2006.01)
*H03K 21/10* (2006.01)

(52) U.S. Cl.
CPC ............. *H03K 3/017* (2013.01); *H03K 5/135* (2013.01); *H03K 21/10* (2013.01)

(58) Field of Classification Search
None
See application file for complete search history.

(56) References Cited

U.S. PATENT DOCUMENTS

| | | | |
|---|---|---|---|
| 9,608,801 B2 | 3/2017 | Perdoor | |
| 9,634,678 B1* | 4/2017 | Caffee | H03L 7/187 |
| 2011/0090940 A1 | 4/2011 | Wadhwa | |
| 2019/0272804 A1* | 9/2019 | Amirkhany | H03K 21/38 |

FOREIGN PATENT DOCUMENTS

| | | |
|---|---|---|
| CN | 102111130 A | 6/2011 |
| TW | 200704051 | 1/2007 |

* cited by examiner

*Primary Examiner* — Cassandra F Cox
(74) *Attorney, Agent, or Firm* — Winston Hsu

(57) ABSTRACT

A device for correcting a duty cycle, comprising: a duty adjustor circuit, configured to receive an input clock signal and a tuning signal, to generate an output clock signal; a first charge pump, configured to charge a first capacitor for a predetermined time period to generate a first voltage; a second charge pump, configured to charge a second capacitor for a time period corresponding to the duty cycle of the output clock signal to generate a second voltage; a first sampling and hold circuit, configured to sample the first voltage to generate a first sampled voltage; a second sampling and hold circuit, configured to sample the second voltage to generate a second sampled voltage; and an error amplifier, configured to generate the tuning signal according to a difference value between the first sampled voltage and the second sampled voltage.

20 Claims, 7 Drawing Sheets

DEVICE FOR CORRECTING DUTY CYCLE AND METHOD FOR CORRECTING DUTY CYCLE

BACKGROUND

A duty cycle correcting circuit is applied to correct a duty cycle of an input clock signal to thereby generate an output clock signal with a desired duty cycle. A conventional duty cycle correcting circuit may have a low pass filter including an operational amplifier, resistors and capacitors to acquire a DC voltage of the output clock signal, such that a tuning signal for tuning the duty cycle of the output clock signal can be generated. However, if a frequency of the output clock signal is low, the low pass filter would need a large circuit area for resistors and capacitors in order to meet the requirement of correction accuracy.

SUMMARY

One objective of the present invention is to provide a device for correcting a duty cycle, which can adjust a duty cycle without a RC circuit with a larger area.

Another objective of the present invention is to provide a method for correcting a duty cycle, which can adjust a duty cycle without a RC circuit with a larger area.

One embodiment of the present application discloses a device for correcting a duty cycle, comprising: a duty adjustor circuit, configured to receive an input clock signal and a tuning signal, to generate an output clock signal, wherein the tuning signal is for adjusting a duty cycle of the output clock signal; a first charge pump, configured to charge a first capacitor for a predetermined time period to generate a first voltage; a second charge pump, configured to charge a second capacitor for a time period corresponding to the duty cycle of the output clock signal to generate a second voltage; a first sampling and hold circuit, coupled to the first charge pump, configured to sample the first voltage to generate a first sampled voltage; a second sampling and hold circuit, coupled to the second charge pump, configured to sample the second voltage to generate a second sampled voltage; and an error amplifier, configured to generate the tuning signal according to a difference value between the first sampled voltage and the second sampled voltage.

Another embodiment of the present application discloses a method for correcting a duty cycle, comprising: (a) generating an output clock signal according to an input clock signal and a tuning signal, wherein the tuning signal is for adjusting a duty cycle of the output clock signal; (b) charging a first capacitor for a predetermined time period to generate a first voltage; (c) charging a second capacitor for a time period corresponding to the duty cycle of the output clock signal to generate a second voltage; and (d) sampling the first voltage to generate a first sampled voltage; (e) sampling the second voltage to generate a first sampled voltage; (f) generating the tuning signal according to a difference value between the first sampled voltage and the second sampled voltage.

In view of above-mentioned embodiments, the duty cycle of the output clock signal can be adjusted based on a relation between the duty cycle thereof and a duty cycle of a frequency divided signal of the output clock signal. Accordingly, no large RC circuit is needed.

These and other objectives of the present invention will no doubt become obvious to those of ordinary skill in the art after reading the following detailed description of the preferred embodiment that is illustrated in the various figures and drawings.

DETAILED DESCRIPTION

In the following descriptions, several embodiments are provided to explain the concept of the present application. The term "first", "second", "third" in following descriptions are only for the purpose of distinguishing different one elements, and do not mean the sequence of the elements. For example, a first device and a second device only mean these devices can have the same structure but are different devices.

In the following descriptions, several embodiments are provided to explain the concept of the present application. The term "first", "second", "third" in following descriptions are only for the purpose of distinguishing different one elements, and do not mean the sequence of the elements. For example, a first device and a second device only mean these devices can have the same structure but are different devices.

Figure 1:
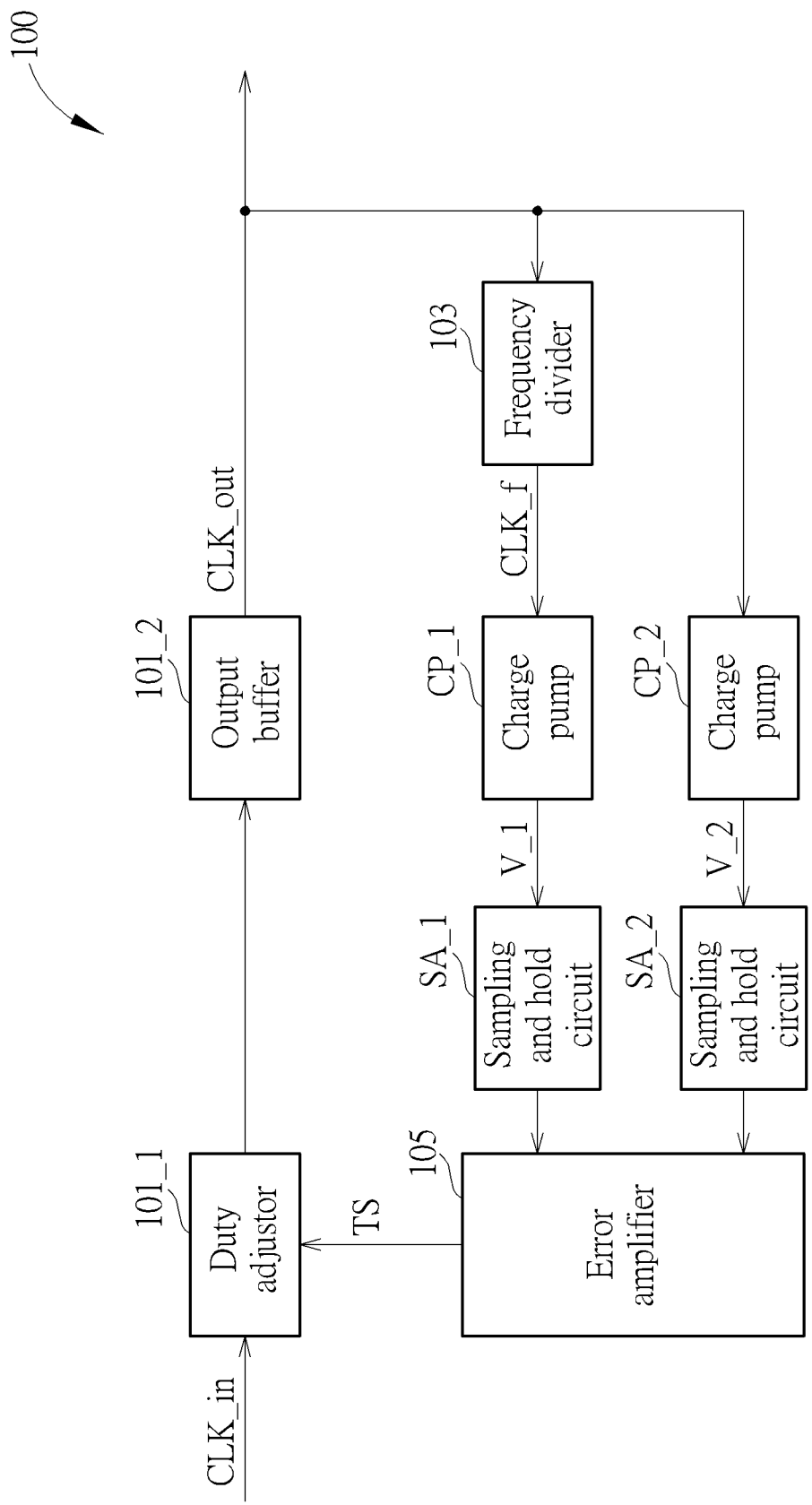
FIG. 1 is a block diagram illustrating a duty cycle correcting circuit according to one embodiment of the present invention.

FIG. 1 is a block diagram illustrating a duty cycle correcting circuit 100 (a device for correcting a duty cycle) according to one embodiment of the present invention. As illustrated in FIG. 1, the duty cycle correcting circuit 100 comprises a duty adjustor circuit 101_1, an output buffer 101_2, a first charge pump CP_1, a second charge pump CP_2, a first sampling and hold circuit SA_1, a second sampling and hold circuit SA_2, and an error amplifier 105. The duty adjustor circuit 101_1 and the output buffer 101_2 are configured to receive an input clock signal CLK_in and a tuning signal TS, to generate an output clock signal CLK_out. The tuning signal TS is for adjusting a duty cycle of the output clock signal CLK_out. Please note, the output buffer 101_2 is configured to drive and adjust a waveform of an output signal from the duty adjustor circuit 101_1, such that the output clock signal CLK_out it outputs can have a better waveform. However, the output buffer 101_2 can be removed if the duty adjustor circuit 101_1 can output an output clock signal CLK_out which has a fine waveform. Also, the output buffer 101_2 can be integrated to the duty adjustor circuit 101_1. Accordingly, the output clock signal CLK_out can be output by the duty adjustor circuit 101_1 rather than the output buffer 101_2.

The frequency divider circuit 103 is configured to receive the output clock signal CLK_out to generate a frequency divided clock signal CLK_f (i.e., a frequency divided signal of the output clock signal CLK_out). A frequency of the frequency divided clock signal CLK_f is 1/N of a frequency of the output clock signal CLK_out, N is an integer greater than 1. In following embodiments, N=2. The first charge pump CP_1 is configured to generate a first voltage V_1 according to the frequency divided clock signal CLK_f. The second charge pump CP_2 is configured to generate a second voltage V_2 according to the output clock signal CLK_out.

The first sampling and hold circuit SA_1 is configured to sample and hold the first voltage V_1 to generate a first sampled voltage (i.e., a reference voltage Vref) into one input terminal of the error amplifier 105. The second sampling and hold circuit SA_2 is configured to sample and hold the second voltage V_2 to generate a second sampled voltage. Also, the error amplifier 105 is configured to generate the tuning signal TS according to a difference value between the first sampled voltage and the second sampled voltage.

Figure 2:
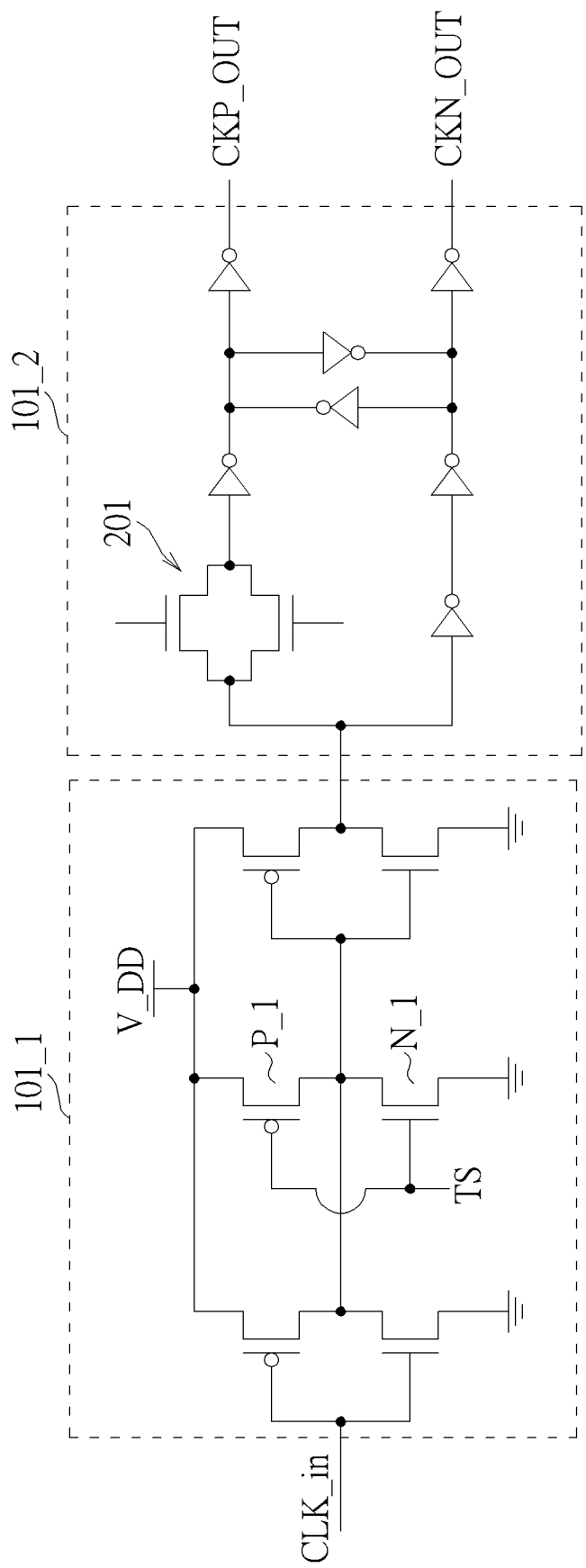
FIG. 2 is a circuit diagram of the duty adjustor circuit and the output buffer illustrated in FIG. 1, according to one embodiment of the present invention.

FIG. 2 is a circuit diagram illustrating the duty adjustor circuit 101_1 and the output buffer 101_2 illustrated in FIG. 1. Please note, FIG. 2 is only an example of the duty adjustor circuit 101_1 and the output buffer 101_2, any circuit which can perform the same function should also fall in the scope of the present invention. As shown in FIG. 2, the duty adjustor circuit 101_1 comprises several PMOSs and NMOSs. The PMOS P_1 and the NMOS N_1, which are coupled in series, receive the tuning signal TS from the error amplifier 105 in FIG. 1. The states of the PMOS P_1 and the NMOS N_1 can be controlled by the voltage levels of the tuning signal TS. Thus, the duty cycle of the output clock signal CLK_out can be adjusted by the voltage levels of the tuning signal TS.

The output buffer 101_2 can be implemented by any conventional buffer circuit. As the example shown in FIG. 2, it comprises a transmission gate 201 and a plurality of inverters. As above-mentioned, the output buffer 101_2 is configured to adjust a waveform of an output signal from the duty adjustor circuit 101_1, such that the output clock signal CLK_out it outputs can have a better waveform. In the embodiment of FIG. 2, the output buffer 101_2 outputs two output clock signals CKP_OUT and CKN_OUT. The phases of the output clock signal CKP_OUT are inverted phases of the output clock signal CKN_OUT. In following embodiment, the output clock signal CKP_OUT is applied as the output clock signal CLK_out illustrated in FIG. 1.

Figure 3:
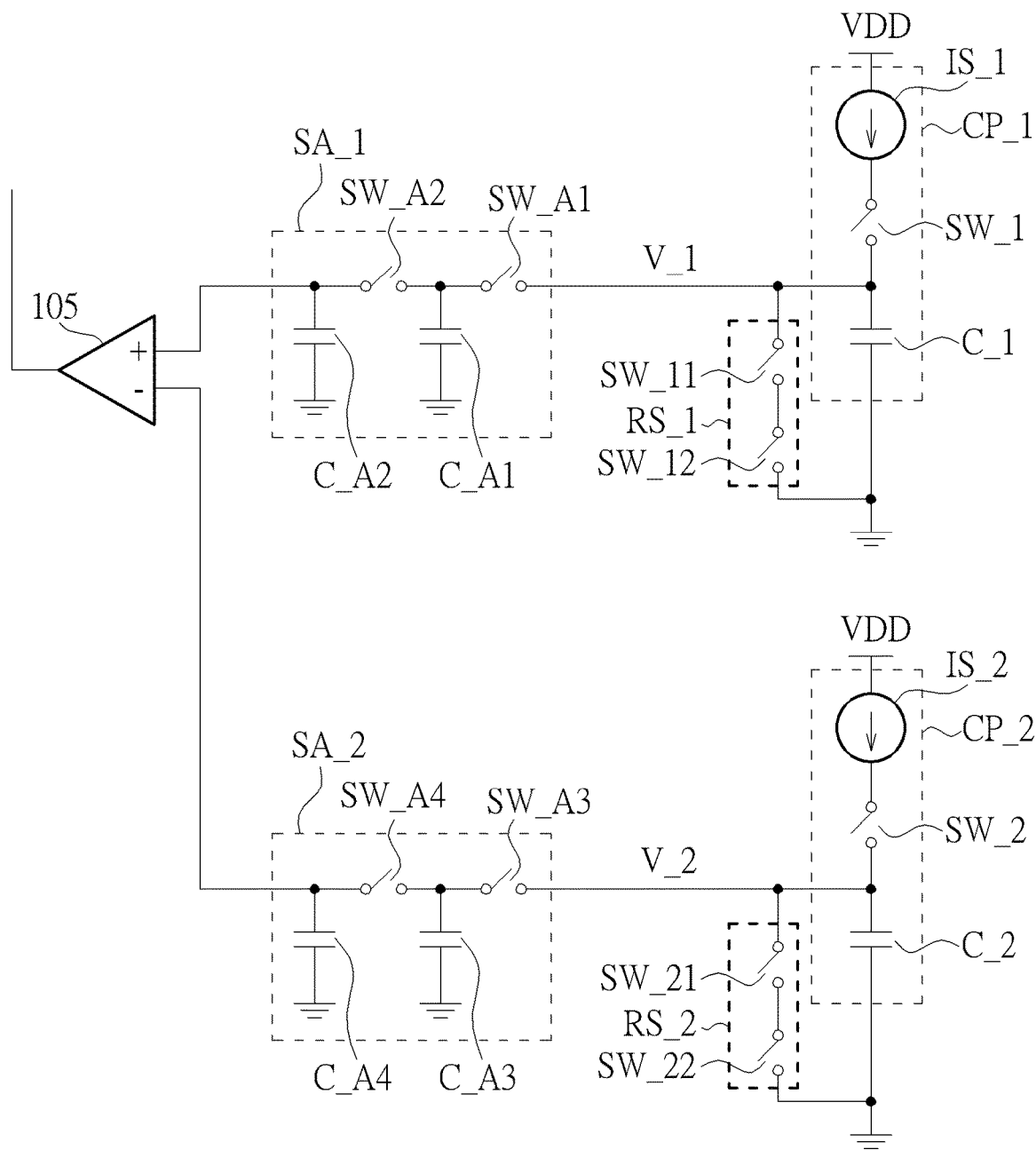
FIG. 3 is a circuit diagram illustrating the first charge pump, the second charge pump and the sample and hold circuits, according to one embodiment of the present invention.

FIG. 3 is a circuit diagram illustrating the first charge pump CP_1, the second charge pump CP_2, the first sample and hold circuit SA_1, and the second sample and hold circuit SA_2, according to one embodiment of the present invention. As shown in FIG. 3, the first charge pump CP_1 comprises a first current source IS_1, a first switch SW_1 and a first capacitor C_1. The first switch SW_1 is coupled between the first current source IS_1 and the first capacitor C_1, wherein the first current source IS_1 charges the first capacitor C_1 when the first switch SW_1 turns on (i.e., being conducted). Besides, the second charge pump CP_2 comprises a second current source IS_2, a second switch SW_2 and a second capacitor C_2. The second switch SW_2 is coupled between the second current source IS_2 and the second capacitor C_2, wherein the second current source IS_2 charges the second capacitor C_2 when the second switch SW_2 turns on (i.e., being conducted).

The first charge pump CP_1 in FIG. 3 further comprises a first reset circuit RS_1 and the second charge pump CP_2 in FIG. 3 further comprises a second reset circuit RS_2. The first reset circuit RS_1 comprises switches SW_11 and SW_12, and is configured to reset the first capacitor C_1. The second reset circuit RS_2 comprises switches SW_21 and SW_22, and is configured to reset the second capacitor C_2. Please note that the first charge pump CP_1 and the second charge pump CP_2 shown in FIG. 3 do not intend to limit the scope of the invention, the switch SW_11 in the first charge pump CP_1 and the switch SW_21 in the second charge pump CP_2 can be omitted.

As above-mentioned, the first voltage V_1 is sampled and held to generate the first sampled voltage and the second voltage V_2 is sampled and held to generate the second sampled voltage. The first sampling and hold circuit SA_1, which is coupled to the first charge pump CP_1, is configured to sample the first voltage V_1 according to the frequency divided clock signal CLK_f. In one embodiment, the first sampling and hold circuit SA_1 samples the first voltage V_1 according to rising edges of the frequency divided clock signal CLK_f. The second sampling and hold circuit SA_2, which is coupled to the second charge pump CP_2, is configured to sample the second voltage V_2 according to the output clock signal CLK_out. In one embodiment, the second sampling and hold circuit SA_2 samples the second voltage V_2 according to the rising edges of the output clock signal CLK_out.

The detail circuitry of the first sampling and hold circuit SA_1 and the second sampling and hold circuit SA_2 are shown in FIG. 3. The first sampling and hold circuit SA_1 comprises switches SW_A1, SW_A2 and capacitors C_A1, C_A2. The switch SW_A1 receives the first pulse signal DIV2_P, and the switch SW_A2 receives the delay signal DIV2_PD of the first pulse signal DIV2_P. Also, the switch SW_A3 receives the second pulse signal CK_P, and the switch SW_A4 receives the delay signal CK_PD of the second pulse signal CK_P. Accordingly, the first sampling and hold circuit SA_1 samples and holds the first voltage V_1 according to the first pulse signal DIV2_P and then further samples and holds the first voltage V_1 according to a delay signal DIV2_PD. Besides, the second sampling and hold circuit SA_2 samples and holds the second voltage V_2 according to the second pulse signal CK_P and then further samples and holds the second voltage V_2 according to a delay signal CK_PD.

In the embodiment of FIG. 3, the first sampling and hold circuit SA_1 and the second sampling and hold circuit SA_2 both comprise two sampling stages. For more detail, the first sampling and hold circuit SA_1 comprises a sampling stage which comprises the switch SW_A1 and the capacitor C_A1, and comprises another sampling stage which comprises the switch SW_A2 and the capacitor C_A2. Additionally, the second sampling and hold circuit SA_2 comprises a sampling stage which comprises the switch SW_A3 and the capacitor C_A3, and comprises another sampling stage which comprises the switch SW_A4 and the capacitor C_A4. Via such structure, the terminal of the first capacitor C_1 is not directly connected to the input terminal of the error amplifier 105 while the first voltage V_1 is sampled. Similarly, the terminal of the second capacitor C_2 is not directly connected to the input terminal of the error amplifier 105 while the second voltage V_2 is sampled. By this way, the disturbance of the sampled voltage input to the error amplifier 105 can be reduced. However, the above illustrated sampling and hold circuit does not intend to limit the scope of the invention, the sampling and hold circuit can only comprise one sampling stage.

Figure 4:
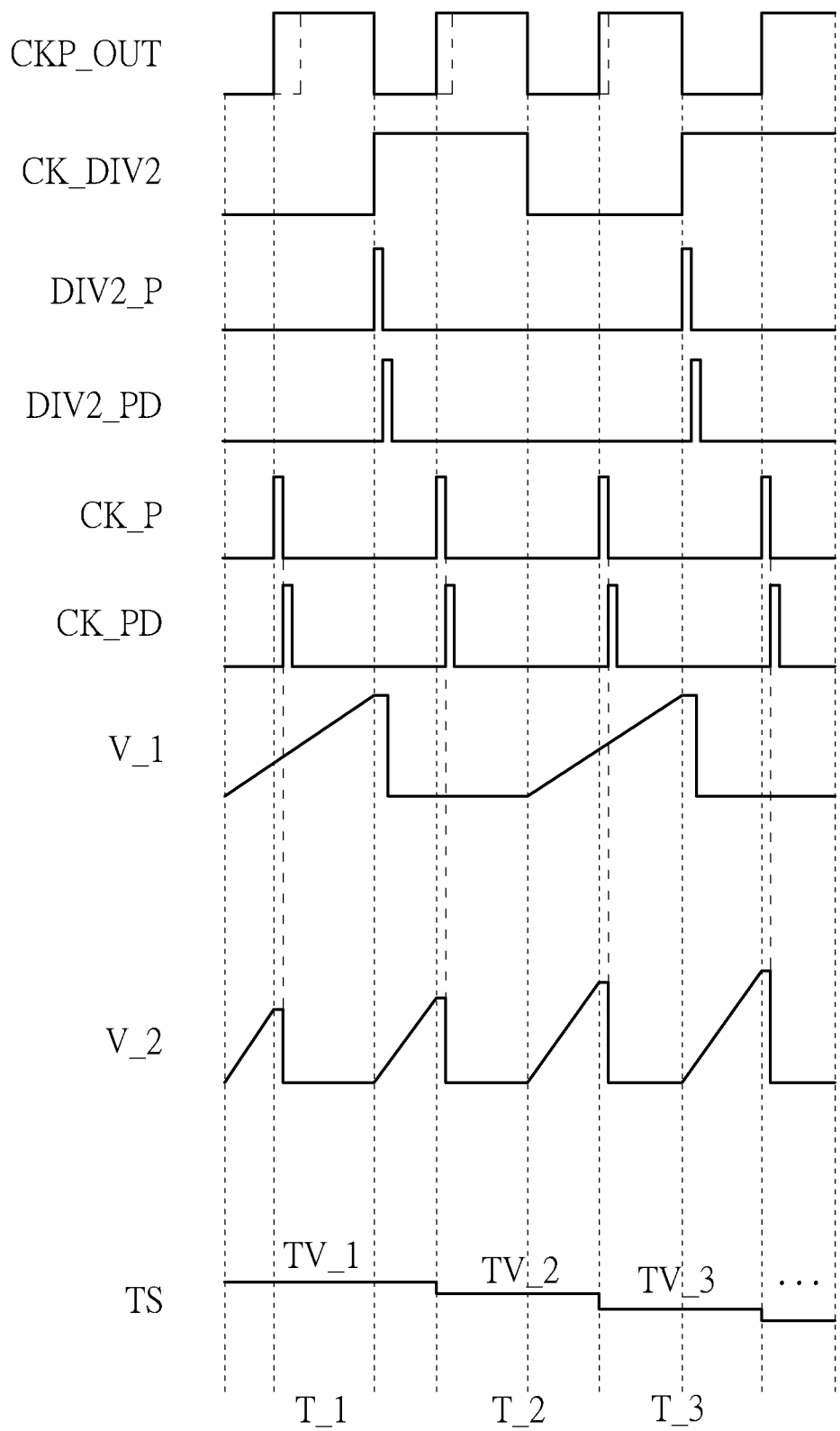
FIG. 4 and FIG. 5 are wave charts of the duty cycle correcting circuit illustrated in FIG. 2 and FIG. 3, according to embodiments of the present invention.
Figure 5:
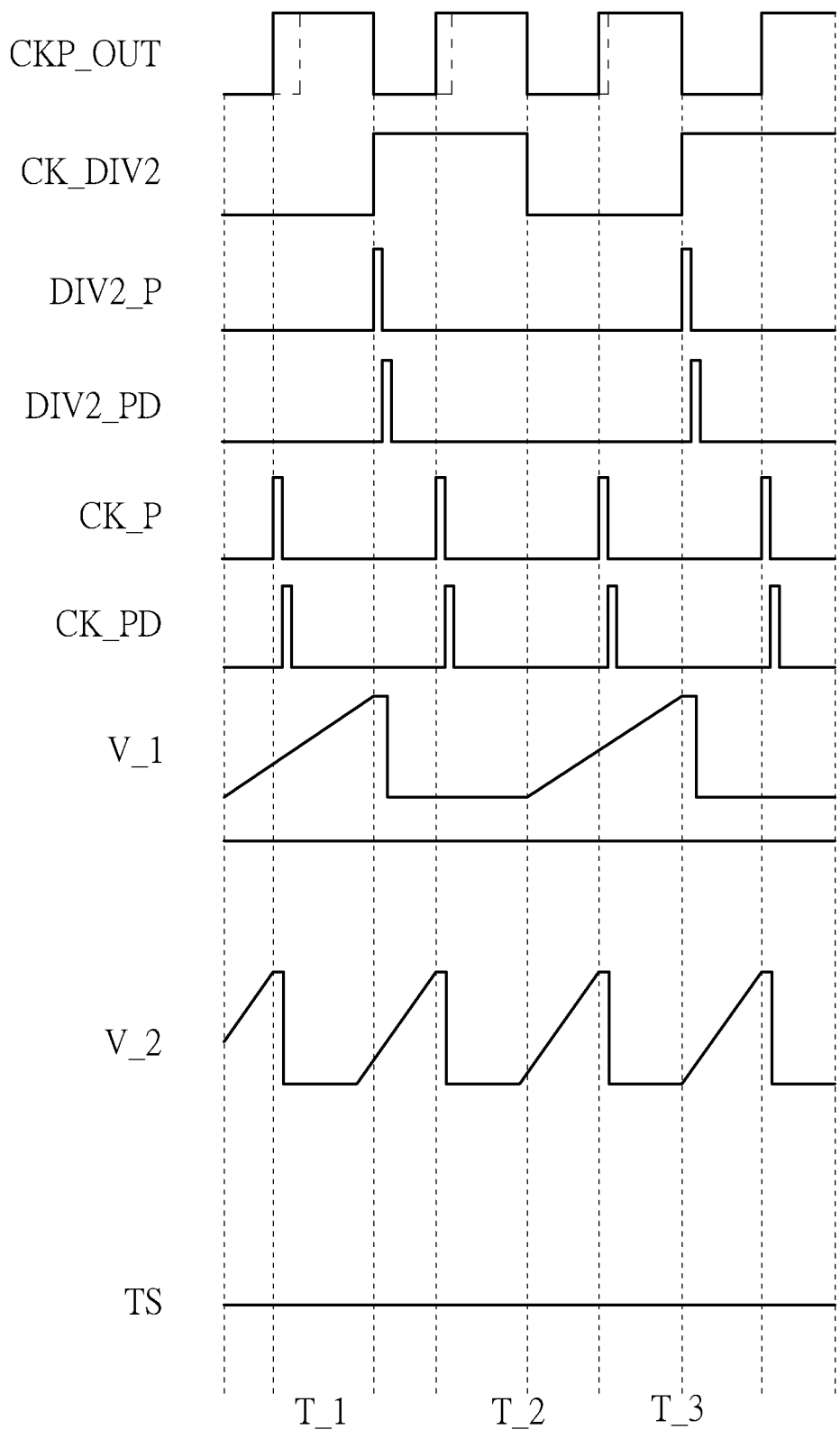

FIG. 4 and FIG. 5 are wave charts of the duty cycle correcting circuit illustrated in FIG. 2 and FIG. 3, according to embodiments of the present invention. Please refer to FIG. 3 while referring to FIG. 4 and FIG. 5, to understand the concepts of the present invention for more clear. In FIG. 4, the output clock signal CKP_OUT is the output clock signal CLK_out illustrated in FIG. 1. Moreover, the frequency divided clock signal CK_DIV2 is the frequency divided clock signal CLK_f in FIG. 1. Taking N=2 as an example, since the period of the output clock signal CLK_out stays constant even if the duty cycle might be changed, thus the high logic duration (i.e., duty cycle) of the frequency divided clock signal CK_DIV2 would stay constant, that is, the high logic duration of the frequency divided clock signal CK_DIV2 equals a cycle period of the output clock signal CLK_out.

Also, the first pulse signal DIV2_P corresponds to rising edges of the frequency divided clock signal CK_DIV2. The pulse signal DIV2_PD is a delay signal of the first pulse signal DIV2_P. The second pulse signal CK_P corresponds to rising edges of the output clock signal CKP_OUT. The pulse signal CK_PD is a delay signal of the second pulse signal CK_P. The first switch SW_1 and the switch SW_11 in FIG. 3 are controlled by an inverted signal DIV2_PB, which is an inverted signal of the first pulse signal DIV2_P. Also, the second switch SW_2 and the switch SW_21 in FIG. 3 are controlled by an inverted signal CK_PB, which is an inverted signal of the second pulse signal CK_P. Additionally, the switch SW_12 in FIG. 3 is controlled by the frequency divided clock signal CK_DIV2, and the switch SW_22 in FIG. 3 is controlled by the output clock signal CKP_OUT. Assume the switches are turned on when the control signals thereof are logic high, and turned off when control signals thereof are logic low. In one embodiment, the operations of the switch SW_11 and the switch SW_21 can keep the first voltage V_1 and the second voltage V_2 to maintain for a while, thereby the sampling operation of the sampling and hold circuits SA_1, SA_2 can be more accurate.

Please refer to FIG. 4 again. In FIG. 4, the first capacitor C_1 is charged when the first switch SW_1 turns on, the switch SW_11 turns on and the switch SW_12 turns off (when the first reset circuit RS_1 is disabled), and is reset when the switch SW_11 turns on and the switch SW_12 turns on (i.e., the first reset circuit RS_1 is enabled). Accordingly, the first capacitor C_1 is charged when the inverted signal DIV2_PB has a high logic level and the frequency divided clock signal CK_DIV2 has a low logic level. That is, when the first pulse signal DIV2_P has a low logic level and the frequency divided clock signal CK_DIV2 has a low logic level. On the opposite, the first capacitor C_1 is reset when the first pulse signal DIV2_P has a low logic level and the frequency divided clock signal CK_DIV2 has a high logic level Thereof, the charging duration of the first capacitor C_1 corresponds to a duty cycle of the frequency divided clock signal CK_DIV2. In one embodiment, a peak value of the first voltage V_1 can be represented as following Equation (1):

$$V\_1 = Tref \times \frac{I1}{CV1}$$ Equation (1)

I1 is a current provided by the first current source IS_1. Also, CV1 is a capacitance value of the first capacitor C_1. In the embodiment of FIG. 4, a frequency of the frequency divided clock signal CK_DIV2 is half of a frequency of the output clock signal CKP_OUT, thus the period of the frequency divided clock signal CK_DIV2 is twice of the period of the output clock signal CKP_OUT, and Tref is one cycle (i.e., a full time period) of the output clock signal CKP_OUT. Further, the frequency of the frequency divided clock signal CK_DIV2 stays the same regardless the duty cycle of the output clock signal CKP_OUT. Accordingly, the peak value of the first voltage V_1 is used as a reference voltage for adjusting the duty cycle of the output clock signal CKP_OUT, when the charging of the first capacitor C_1 is completed (the first voltage V1 reaches its peak value) and the first voltage V_1 is hold by the first sample and hold circuit SA_1.

Similarly, in FIG. 4, the second capacitor C_2 is charged when the second switch SW_2 and the switch SW_21 turn on and the switch SW_22 turns off, and is reset when the switch SW_21 turns on and the switch SW_22 turns on. Accordingly, the second capacitor C_2 is charged when the inverted signal CK_PB has a high logic level and output clock signal CKP_OUT has a low logic level. That is, when the second pulse signal CK_P has a low logic level and the output clock signal CKP_OUT has a low logic level. On the opposite, the second capacitor C_2 is reset when the second pulse signal CK_P has a low logic level and the output clock signal CKP_OUT has a high logic level.

Thereof, the charging duration of the second capacitor C_2 corresponds to a duty cycle of the output clock signal CKP_OUT. That is, the second capacitor C_2 is charged during the low logic of the output clock signal CKP_OUT. In one embodiment, a peak value of the second voltage V_2 can be represented as following Equation (2):

$$V\_2 = (1 - \text{duty}) \times Tref \times \frac{I2}{CV2}$$ Equation (2)

I2 is a current provided by the second current source IS_2. Also, CV2 is a capacitance value of the second capacitor C_2. The parameter "duty" here means a duty cycle of the output clock signal CLK_out. As above-mentioned, Tref is a predetermined time period. Accordingly, the desired parameter "duty" can be determined by I1, CV1, I2 and CV2. In the embodiment of FIG. 4, the desired parameter "duty" is set to be 50%.

In one embodiment, the duty cycle of the output clock signal CLK_out is adjusted according to differences between peak values of the first voltage V_1 and the second voltage V_2 (difference value between the first sampled voltage and the second sampled voltage). In the embodiment of FIG. 4, the solid lines of the output clock signal CKP_OUT mean a current duty cycle of the output clock signal CKP_OUT, and the dotted lines of the output clock signal CKP_OUT mean a desired duty cycle of the output clock signal CKP_OUT. In the early time period T_1, the duty cycle of the output clock signal CKP_OUT is not 50%, thus a larger difference is between peak values of the first voltage V_1 and the second voltage V_2. Therefore, the error amplifier 105 outputs a tuning signal TS with a tuning voltage level TV_1 to the duty adjustor circuit 101_1, thereby the duty cycle of the output clock signal CKP_OUT is adjusted.

In the time period T_2, the peak value of the second voltage V_2 is increased but is still different from the peak value of the first voltage V_1, thus the error amplifier 105 outputs a tuning signal TS with a tuning voltage level TV_2 to the duty adjustor circuit 101_1, thereby the duty cycle of the output clock signal CKP_OUT is further adjusted. Such steps are repeated until the peak values of the first voltage V_1 and the second voltage V_2 are identical.

When the peak value of the second voltage V_2 is increased to be the same as the peak value of the first voltage V_1, the adjustment of the duty cycle of the output clock signal CKP_OUT is completed. In other words, the duty cycle of the output clock signal CKP_OUT is adjusted to be 50%. The duty cycle correcting circuit 100 enters a stable state. As shown in FIG. 5, the output clock signal CKP_OUT is already adjusted to be 50%, thus the duty cycle correcting circuit 100 enters a stable state. Accordingly, in FIG. 5, the peak values of the first voltage V_1 and the second voltage V_2 are identical, and the tuning signal TS has a fixed value.

For more detail, the following Equations (3) and (4) can be acquired, since the peak values of the first voltage V_1 and the second voltage V_2 are identical when the duty cycle correcting circuit 100 enters the stable state. Accordingly, a desired duty can be acquired via set I1, I2, CV1 and CV2.

$$Tref \times \frac{I1}{CV1} = (1 - \text{duty}) \times Tref \times \frac{I2}{CV2} \quad \text{Equation (3)}$$

$$\frac{I1}{CV1} = (1 - \text{duty}) \times \frac{I2}{CV2} \quad \text{Equation (4)}$$

In view of above-mentioned embodiments, the operations of the duty cycle correcting circuit provided by the present invention can be summarized as: performs frequency dividing to the output clock signal CLK_out to generate the frequency divided clock signal CLK_f. The first capacitor C_1 is charged during a low logic level of the frequency divided clock signal CLK_f, which is equal to a full time period of the output clock signal CLK_out, to generate a reference voltage Vref with a predetermined voltage level. Since the full time period of the output clock signal CLK_out is a known time period, the first capacitor C_1 is charged for a predetermined time period. Besides, the second capacitor C_2 is charged during a low logic level of the output clock signal CLK_out (i.e., a time period corresponding to the duty cycle of the output clock signal). The voltage of the second capacitor C_2 is sampled and held to generate a second sampled voltage of the second voltage V_2. Then, the reference voltage Vref and the second sampled voltage are compared, to generate the tuning signal TS, which is used to adjust the duty cycle of the output clock signal CLK_out.

Figure 6:
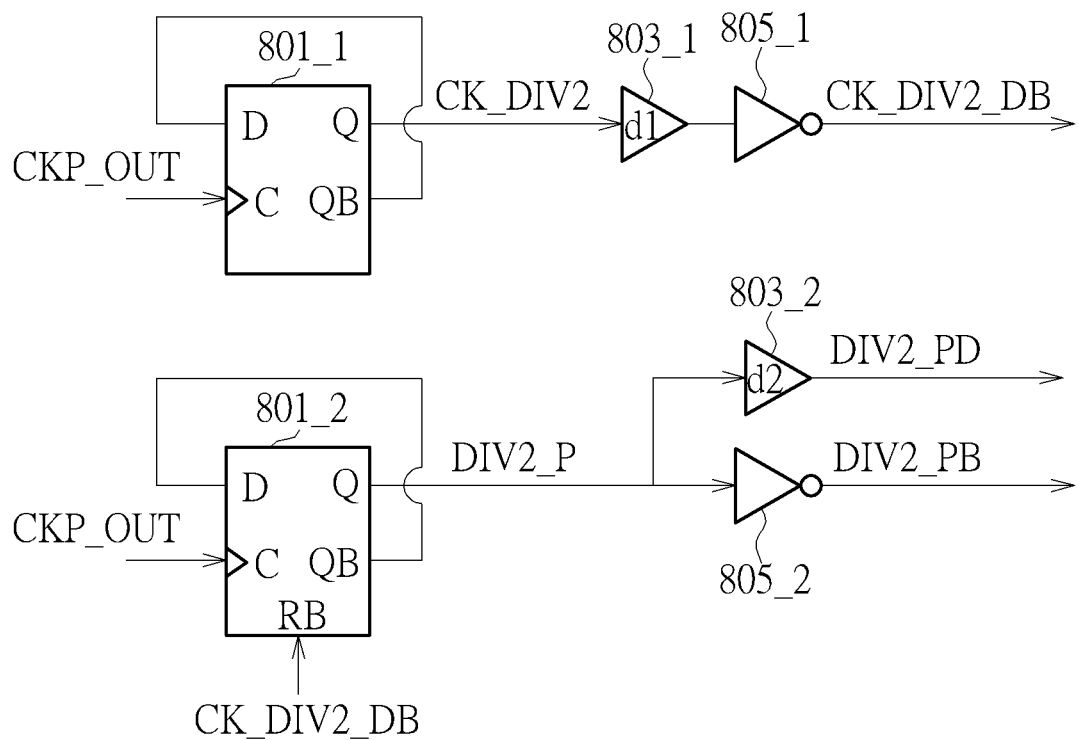
FIG. 6 and FIG. 7 are circuit diagrams illustrating circuits for generating signals in FIG. 4 and FIG. 5, according to embodiments of the present invention.
Figure 7:
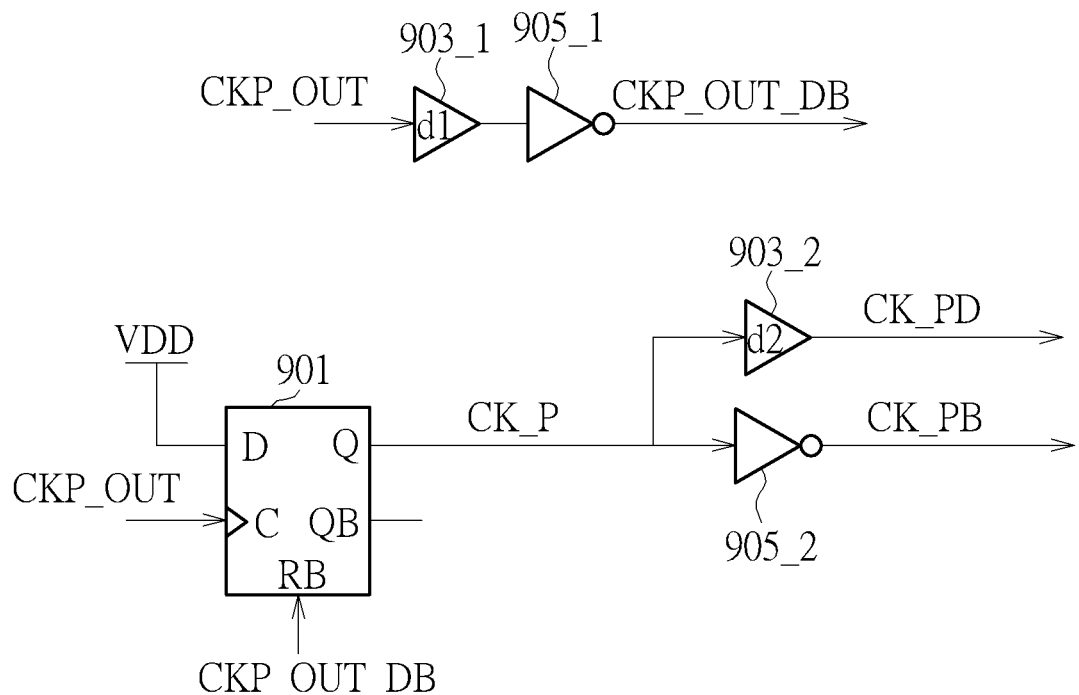

The signals in FIG. 4 and FIG. 5 can be generated via various circuitries. FIG. 6 and FIG. 7 are circuit diagrams illustrating circuits for generating signals in FIG. 4 and FIG. 5, according to embodiments of the present invention. Please note, the circuits in FIG. 6 and FIG. 7 are only examples for explaining. The circuits which can perform the same functions should also fall in the scope of the present invention.

In the embodiment of FIG. 6, the frequency divided clock signal CK_DIV2 is generated by a D flip flop 801_1 which receives the output clock signal CKP_OUT. Also, a signal CK_DIV2_DB, which is a delayed signal of an inverted signal of the frequency divided clock signal CK_DIV2, is generated by a delay unit 803_1 and an inverter 805_1. Further, the first pulse signal DIV2_P is generated by a D flip flop 801_2 which receives the output clock signal CKP_OUT and the signal CK_DIV2_DB. Also, the inverted signal DIV2_P is generated by a delay unit 803_2 which receives the first pulse signal DIV2_P. Besides, the inverted signal DIV2_PB is generated by an inverter 805_2 which receives the first pulse signal DIV2_P.

In the embodiment of FIG. 7, a signal CKP_OUT_DB, which is a delayed signal of an inverted signal of the output clock signal CKP_OUT, is generated by a delay unit 903_1 and an inverter 905_1. Also, the second pulse signal CK_P is generated by a D flip flop 901 which receives the output clock signal CKP_OUT and the signal CKP_OUT_DB. Besides, the inverted signal CK_PD is generated by a delay unit 903_2 which receives the second pulse signal CK_P. Furthermore, the inverted signal CK_PB is generated by an inverter 905_2 which receives the second pulse signal CK_P.

Figure 8:
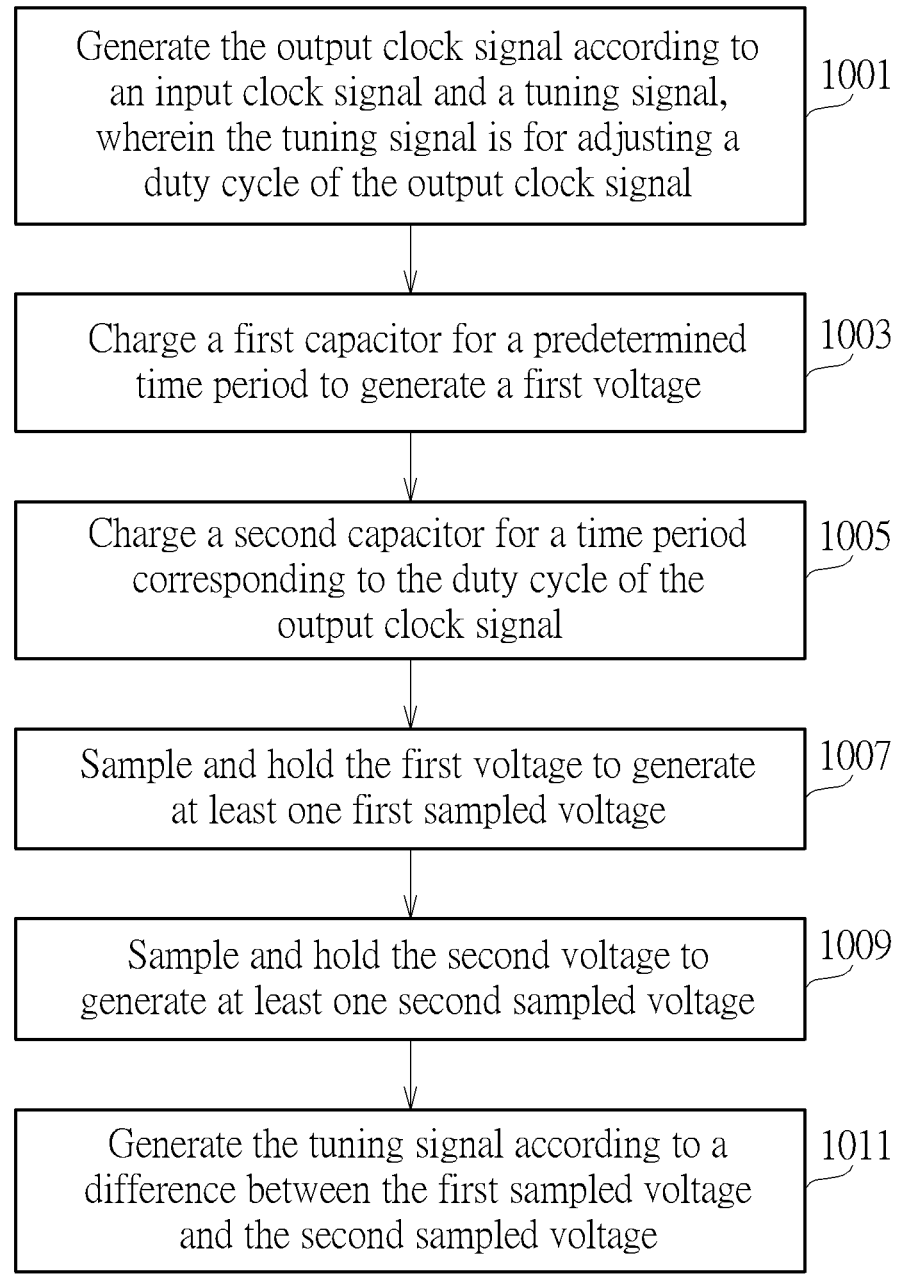
FIG. 8 is a flow chart illustrating a duty cycle correcting method according to one embodiment of the present invention.

FIG. 8 is a flow chart illustrating a duty cycle adjusting method according to one embodiment of the present invention. The duty cycle adjusting method in FIG. 8 is applied to adjust a duty cycle of an output clock signal (e.g., the output clock signal CLK_f in FIG. 1) and comprises following steps:

Step 1001
Generate the output clock signal according to an input clock signal (e.g., the input clock signal CLK_in) and a tuning signal (e.g., the tuning signal TS), wherein the tuning signal is for adjusting a duty cycle of the output clock signal.

Step 1003
Charge a first capacitor for a predetermined time period to generate a first voltage. The predetermined time period can be, for example, a full time period of the output clock signal CLK_out.

Step 1005
Charge a second capacitor for a time period corresponding to the duty cycle of the output clock signal. The time period can be, for example, a low logic of the output clock signal CLK_out.

Step 1007
Sample and hold the first voltage to generate at least one first sampled voltage.

Step 1009
Sample and hold the second voltage to generate at least one second sampled voltage.

Step 1011
Generate the tuning signal according to a difference value between the first sampled voltage and the second sampled voltage.

Other detail steps are illustrated in above-mentioned embodiments, thus are omitted for brevity here.

In view of above-mentioned embodiments, the duty cycle of the output clock signal can be adjusted based on a relation between the duty cycle thereof and a duty cycle of a frequency divided signal of the output clock signal. Accordingly, no large RC circuit is needed.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A device for correcting a duty cycle, comprising:
   a duty adjustor circuit, configured to receive an input clock signal and a tuning signal, to generate an output clock signal, wherein the tuning signal is for adjusting a duty cycle of the output clock signal;
   a first charge pump, configured to charge a first capacitor for a predetermined time period to generate a first voltage;

a second charge pump, configured to charge a second capacitor for a time period corresponding to the duty cycle of the output clock signal to generate a second voltage;
a first sampling and hold circuit, coupled to the first charge pump, configured to sample the first voltage to generate a first sampled voltage;
a second sampling and hold circuit, coupled to the second charge pump, configured to sample the second voltage to generate a second sampled voltage; and
an error amplifier, configured to generate the tuning signal according to a difference value between the first sampled voltage and the second sampled voltage.

2. The device of claim 1, further comprising:
a frequency divider circuit, configured to receive the output clock signal to generate a frequency divided clock signal, wherein a frequency of the frequency divided clock signal is 1/N of a frequency of the output clock signal;
wherein the predetermined time period is a time period corresponding to a duty cycle of the frequency divided clock signal.

3. The device of claim 2, wherein N is 2.

4. The device of claim 2,
wherein the first sampling and hold circuit is configured to sample the first voltage according to the frequency divided clock signal;
wherein the second sampling and hold circuit is configured to sample the second voltage according to the output clock signal.

5. The device of claim 1, wherein the first charge pump generates the first voltage by charging the first capacitor of the first charge pump.

6. The device of claim 5, wherein the first charge pump comprises:
a first current source;
a first reset circuit, configured to reset a voltage of the first capacitor; and
a first switch, coupled between the first current source and the first capacitor, wherein the first current source charges the first capacitor when the first switch turns on and the first reset circuit is disabled, and the first capacitor is discharged when the first switch turns off and the first reset circuit is enabled.

7. The device of claim 6, further comprising:
a first pulse circuit, configured to generate a first pulse signal according to a frequency divided signal of the output clock signal;
wherein the first switch is configured to receive an inverted signal of the first pulse signal to correspondingly be turned on or turned off;
wherein the first reset circuit is configured to reset the voltage of the first capacitor according to the inverted signal of the first pulse signal and the frequency divided signal.

8. The device of claim 1,
wherein the second charge pump further comprises:
a second current source;
a second reset circuit, configured to reset a voltage of the second capacitor; and
a second switch, coupled between the second current source and the second capacitor, wherein the second current source charges the second capacitor when the second switch turns on and the second reset circuit is disabled, and the second capacitor is discharged when the second switch turns off and the second reset circuit is enabled.

9. The device of claim 8, further comprising:
a second pulse circuit, configured to generate a second pulse signal according to the output clock signal;
wherein the second switch is configured to receive an inverted signal of the second pulse signal to correspondingly be turned on or turned off;
wherein the second reset circuit is configured to reset the voltage of the second capacitor according to the inverted signal of the second pulse signal and the output clock signal.

10. The device of claim 1, further comprising:
a first pulse circuit, configured to generate a first pulse signal according to a frequency divided signal of the output clock signal;
wherein the first sampling and hold circuit is configured to sample the first voltage according to the first pulse signal.

11. The device of claim 1, further comprising:
a second pulse circuit, configured to generate a second pulse signal according to the output clock signal;
wherein the second sampling and hold circuit is configured to sample the second voltage according to the second pulse signal.

12. A method for correcting a duty cycle, comprising:
(a) generating an output clock signal according to an input clock signal and a tuning signal, wherein the tuning signal is for adjusting a duty cycle of the output clock signal;
(b) charging a first capacitor for a predetermined time period to generate a first voltage;
(c) charging a second capacitor for a time period corresponding to the duty cycle of the output clock signal to generate a second voltage; and
(d) sampling the first voltage to generate a first sampled voltage;
(e) sampling the second voltage to generate a second sampled voltage;
(f) generating the tuning signal according to a difference value between the first sampled voltage and the second sampled voltage.

13. The method of claim 12, further comprising:
performing a frequency dividing operation to the output clock signal to generate a frequency divided clock signal, wherein a frequency of the frequency divided clock signal is 1/N of a frequency of the output clock signal;
wherein the predetermined time period is a time period corresponding to a duty cycle of the frequency divided clock signal.

14. The method of claim 13, wherein N is 2.

15. The method of claim 13,
wherein the step (d) samples the first voltage according to the frequency divided clock signal;
wherein the step (e) samples the second voltage according to the output clock signal.

16. The method of claim 12, wherein the first charge pump generates the first voltage by charging the first capacitor of the first charge pump.

17. The method of claim 16, further comprising:
generating a first pulse signal according to a frequency divided signal of the output clock signal;
resetting the first capacitor according to the inverted signal of the first pulse signal and the frequency divided signal.

18. The method of claim 12, further comprising:
generating a second pulse signal according to the output clock signal;

resetting the second capacitor according to the inverted signal of the second pulse signal and the output clock signal.

19. The method of claim 12, further comprising:

generating a first pulse signal according to a frequency divided signal of the output clock signal;

wherein the step (d) samples the first voltage according to the first pulse signal.

20. The method of claim 12, further comprising:

generating a second pulse signal according to the output clock signal;

wherein the step (g) samples the second voltage according to the second pulse signal.

* * * * *